United States Patent
Ruszczyk et al.

(10) Patent No.: US 12,009,165 B2
(45) Date of Patent: Jun. 11, 2024

(54) SWITCH FOR MV OR HV TRACTION LINE TEST DEVICE

(71) Applicant: ABB Schweiz AG, Baden (CH)

(72) Inventors: Adam Ruszczyk, Cracow (PL); Krzysztof Koska, Cracow (PL); Piotr Oramus, Cracow (PL)

(73) Assignee: ABB Schweiz AG, Baden (CH)

( * ) Notice: Subject to any disclaimer, the term of this patent is extended or adjusted under 35 U.S.C. 154(b) by 214 days.

(21) Appl. No.: 17/577,260

(22) Filed: Jan. 17, 2022

(65) Prior Publication Data

US 2022/0139650 A1    May 5, 2022

Related U.S. Application Data

(63) Continuation of application No. PCT/EP2020/070091, filed on Jul. 16, 2020.

(30) Foreign Application Priority Data

Jul. 18, 2019  (EP) ..................... 19187143

(51) Int. Cl.
*H01H 33/28*      (2006.01)
*H01H 33/42*      (2006.01)
*H01H 33/66*      (2006.01)

(52) U.S. Cl.
CPC ............ *H01H 33/66* (2013.01); *H01H 33/28* (2013.01); *H01H 33/423* (2013.01)

(58) Field of Classification Search
CPC ...... H01H 33/66; H01H 33/28; H01H 33/423; H01H 33/14; H01H 33/666; H01H 9/40;
(Continued)

(56) References Cited

U.S. PATENT DOCUMENTS 8,598,745 B2 * 12/2013 Urano ..................... H02J 50/12
                                                          307/104
9,160,176 B2 * 10/2015 Fukushima ........... H01F 27/006
(Continued)

FOREIGN PATENT DOCUMENTS

CN   105353221 A    2/2016
DE   10217743 A1    12/2002
(Continued)

OTHER PUBLICATIONS

European Patent Office, International Search Report in International Patent Application No. PCT/EP2020/070091, 5 pp., (dated Oct. 13, 2020).

(Continued)

*Primary Examiner* — William A Bolton
(74) *Attorney, Agent, or Firm* — Leydig, Voit & Mayer, Ltd.

(57) ABSTRACT

A switch for a medium or high voltage traction line testing device includes a plurality of normally-opened pairs of contacts connected in series, wherein each pair of contacts is equipped with a separate control coil. The switch further comprises a wireless power transfer supply module being on ground potential for supplying cascaded wireless power transfer receivers comprising the transmitting coil, high frequency inverter and microcontroller, a plurality of cascaded wireless power transfer receivers for supplying control coil of pairs of contacts. Each of the wireless power transfer receivers is referenced to the floating potential and comprises a receiving coil. Each of the control coils is connected to one of the wireless power transfer receivers. The receiving coils of the wireless power transfer receivers are magnetically coupled, and a wireless power transfer supply module is located in the middle of the cascaded wireless power transfer receivers.

16 Claims, 2 Drawing Sheets

(58) Field of Classification Search
CPC .......... H01H 9/54; H01H 36/00; H01H 50/54; H01H 31/14; H01H 31/52; H02J 50/10; H02J 50/05; H02J 50/12; H02J 50/502
USPC ............... 218/118, 4–6, 28, 67, 69; 307/104
See application file for complete search history.

(56) References Cited

U.S. PATENT DOCUMENTS

| | | | | |
|---|---|---|---|---|
| 9,991,818 | B2* | 6/2018 | Mehas | H02M 7/23 |
| 2016/0322184 | A1* | 11/2016 | Schmitz | H03K 17/567 |
| 2017/0222466 | A1* | 8/2017 | Sankar | H02J 7/0029 |
| 2018/0205265 | A1* | 7/2018 | Park | H02J 50/12 |
| 2018/0212511 | A1* | 7/2018 | Mao | H02J 7/00712 |
| 2018/0375379 | A1* | 12/2018 | Buenrostro | H02J 50/80 |
| 2019/0097458 | A1* | 3/2019 | Oh | H02J 50/12 |
| 2019/0115788 | A1* | 4/2019 | Zhang | H02M 3/33571 |

FOREIGN PATENT DOCUMENTS

| | | |
|---|---|---|
| DE | 102014002298 B3 | 1/2015 |
| EP | 0555946 A1 | 8/1993 |
| GB | 1225131 A | 3/1971 |
| WO | WO 2018/041874 A1 | 3/2018 |

OTHER PUBLICATIONS

European Patent Office, Written Opinion in International Patent Application No. PCT/EP2020/070091, 6 pp., (dated Oct. 13, 2020).
European Patent Office, Extended European Search Report in European Patent Application No. 19187143.3, 5 pp. (dated Jan. 17, 2020).
Thomson Scientific, "Database WPI, Week 201618," XP-002796613, 1 p. (2017).

* cited by examiner

SWITCH FOR MV OR HV TRACTION LINE TEST DEVICE

CROSS-REFERENCE TO RELATED APPLICATIONS

This patent application claims priority to International Patent Application No. PCT/EP2020/070091, filed on Jul. 16, 2020, and European Patent Application No. 19187143.3, filed Jul. 18, 2019, each of which is incorporated herein in its entirety by reference.

FIELD OF THE DISCLOSURE

The present disclosure generally relates to a switch for MV or HV traction line test device comprising multiple pairs of contacts connected in series and controlled by separated multiple coils. In one embodiment, the switch is able to reclose in a millisecond range and can operate in medium or high voltage systems which are characterized with high load impedance. Exemplary applications of the switch are generation of short voltage pulses to the high impedance load or providing temporary galvanic insulation between the voltage sensor and the medium voltage source.

BACKGROUND OF THE INVENTION

Requirements for the MV and HV mechanical switch for traction line test device are challenging. On the one hand, very small current rating of the device enables utilization of small contacts with low inertia which could be fast. On the other hand, achieving high voltage withstand capability needs wider isolation gap between the contacts. This implies slower operation of the switch.

Voltage withstand capability of the medium voltage switch (e.g. vacuum interrupter) is obtained by providing sufficient gap between the switch contacts. Typical medium voltage switch is designed in respect to the possibility to the occurrence of relatively large short-circuit currents and electrodynamic forces therefore contacts of the MV switches are large and heavy with relatively large inertia and operation of the switch is relatively slow (>15 ms).

The control of all switching elements (opening and closing) must be done simultaneously with a tolerance of typically less than a millisecond, since the total voltage across the switch cascade would otherwise unevenly distributed to their individual elements and it could lead to overvoltage of individual semiconductor switching elements and thus to their destruction.

In order to provide millisecond range reclosing operation of the switch large, costly and complicated actuator system are used (e.g., Thomson drive).

Such medium voltage switches are not optimized for applications with high impedance of the load. In systems where load is characterized with high impedance smaller contacts shall be used. However, still sufficient gap between the contacts is needed to provide sufficient voltage withstand capability.

The known solution of that problem is to replace single pair of the contacts and single large gap with several pairs of contacts with smaller gaps connected in series. This solution increase of the voltage withstand capability of the switch. However, it is characterized with complicated mechanical actuator system which must provide simultaneous reclosing operation of all pairs of the switch contacts and provide proper galvanic insulation between them.

In case that each pair of contacts is controlled by the separate coil, galvanic separation between the coils is needed.

What is more a total voltage across the medium or high voltage switch should be evenly distributed between cascaded pairs of contacts. The total voltage rating of the switch should be $n \times V_{BR\ contact/contact}$, where n is number of pairs of contacts connected in the cascade and $V_{BR\ contact/contact}$ is breakdown voltage between contacts of the pairs of contacts.

Rated voltage between contacts and driving coil of the pairs of contacts is limited and it equals $V_{BR\ contact/coil}$. Due to this fact, driving coils of cascaded pairs of contacts cannot be connected to the same potential and also cannot be connected to the ground. Otherwise, electric potential from the first coil in the cascade will be same as the last coil and total voltage rating of the cascade will be only $2 \times V_{BR\ contact/coil}$ regardless to quantity of the pairs of contacts in series, therefore isolated power supplies for relay control coils is needed.

German patent DE102014002298 relates to the device for galvanically isolated transmitting control signals for a cascaded high voltage switch. The device for electrically isolated transmission of the control signals has at least one connectable to a drive circuit for the high voltage switch primary winding and a plurality of connectable to the semiconductor switching elements of the high voltage switch secondary windings, which are arranged magnetically coupled to the primary winding. The primary and secondary windings are formed as conductor tracks on or in one or more printed circuit boards and are penetrated by the magnetic field of a single magnetic core, which is arranged on the or the circuit boards. The proposed device is thus a common planar transformer for the isolated driving of all or at least some of the switching elements of a cascaded high-voltage switch. This planar transformer has only one magnetic core for all windings arranged on or in the planar transformer. In principle, several of those planar transformers can be used for the control of a cascaded high-voltage switch, each of the planar transformer then each controls a group of switching elements.

BRIEF SUMMARY OF THE INVENTION

In one aspect, the present disclosure provides a new construction of the MV or HV switch having high voltage rating of the switch and providing proper galvanic insulation of the control coils which does not have the above-mentioned problems and can be produced inexpensively and reproducibly in terms of electrical properties.

In another aspect, the disclosure describes a switch for medium or high voltage traction line testing device comprising plurality of normally-opened pairs of contacts connected in series wherein each pair of contacts is equipped with a separate control coil. The switch further comprises a wireless power transfer supply module being on ground potential for supplying cascaded wireless power transfer receivers comprising the transmitting coil, high frequency inverter and microcontroller, plurality of cascaded wireless power transfer receivers for supplying control coil of pairs of contacts. Each of the wireless power transfer receiver is referenced to the floating potential and comprises receiving coil. Each of control coils is connected to one of the wireless power transfer receivers. Furthermore, receiving coils of wireless power transfer receivers are magnetically coupled. What is more, a wireless power transfer supply module is located in the middle of the cascaded wireless power transfer receivers.

Advantageous embodiments of the device are the subject of the dependent claims or can be found in the following description and the embodiment.

A switch in accordance with an embodiment may also include blocking diodes connected in series with pairs of contacts.

In one embodiment, the switch comprises a plurality of modules, each module comprising pairs of contacts, control coil, wireless power transfer receiver and blocking diode. The blocking diode shall be rated for same voltage as a pair of contacts.

In addition the switch further comprises balancing capacitors arranged in parallel to each pairs of contacts and/or comprises balancing capacitor arranged in parallel to blocking diodes so that even voltage distribution between wireless power transfer receiver can be obtained.

The switch may also comprise a pairs of contacts which are made as vacuum reed relays.

The switch may also comprise balancing resistors placed in parallel to each of pairs of contacts so that equal sharing of DC component can be obtained. The resistance of balancing resistors is one range lower than DC resistance of the pairs of contacts.

Each of the wireless power transfer receivers of the switch may also include an additional capacitor energy bank. The capacitor energy bank may be embodied in the form of a ceramic SMD capacitor.

Each of wireless power transfer receivers may also be equipped with one-way communication link with the wireless power transfer supply module for sending signal about closing of the relays.

Each of the wireless power transfer receivers may also include an electronic rectifier and triggering circuit for the control coil.

The wireless power transfer receivers may be manufactured as the PCB.

The high frequency inverter of the wireless power transfer supply module may operate with frequency in the range between 100-300 kHz. Inverter is responsible for the excitation of the transmitting coil.

The pairs of contacts may have a meandering arrangement, including with a layer of silicon resin between each of the pairs of contacts, which may significantly improve the volume utilization, and proper isolation between the pairs of contacts.

Coils of the switch are supplied by a cascaded inductive power transfer circuit comprising a plurality of cascaded wireless power transfer receivers providing galvanic insulation between the particular coils, which arrangement allows also to achieve sufficient isolation between coils and coils to ground.

Utilization of the wireless power transfer (WPT) technology for driving coils of the pairs of contacts, e.g., mechanical relays, allows to increase voltage capabilities of the switch and provide proper galvanic isolation between the coils.

The switch is advantageously scalable. WPT technology has relatively high efficiency, which means that large number of pairs of contacts may be connected in series. It can be extended for higher voltages (HV) and high current circuit breakers like Vacuum Interrupters.

The construction of the switch according to embodiments of the disclosure does not contain any magnetic cores, which makes the switch cost efficient.

BRIEF DESCRIPTION OF THE SEVERAL VIEWS OF THE DRAWING(S)

The proposed switch will be explained in more detail using an exemplary embodiment in conjunction with the drawings. The invention is shown by means of example embodiments on a drawing, in which.

DETAILED DESCRIPTION OF THE INVENTION

Figure 1:
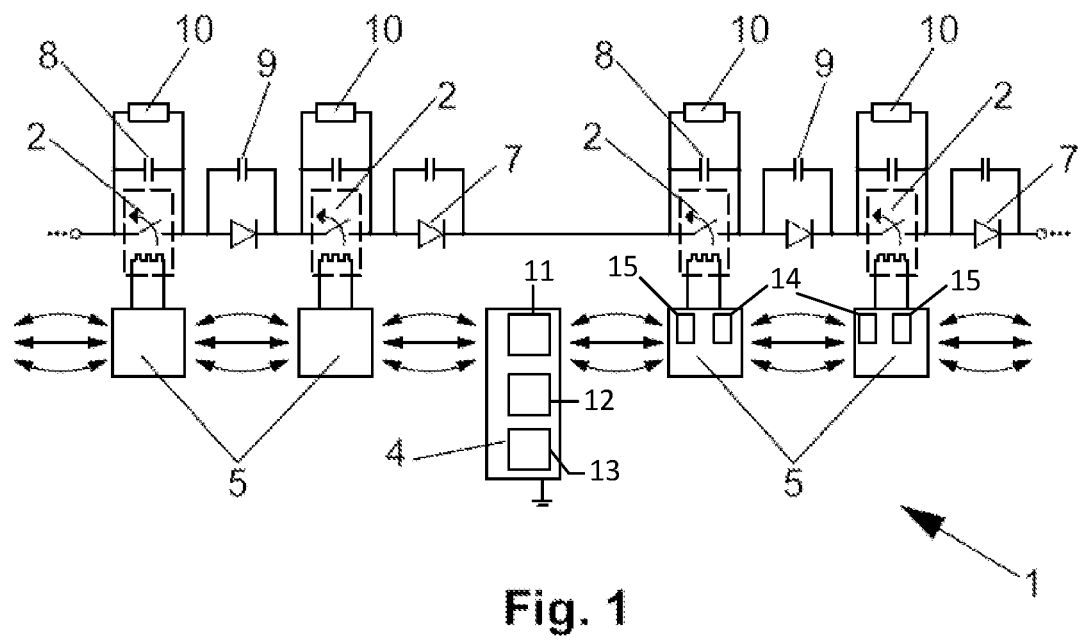
FIG. 1 is a schematic diagram of the proposed switch in accordance with the disclosure.
Figure 2:
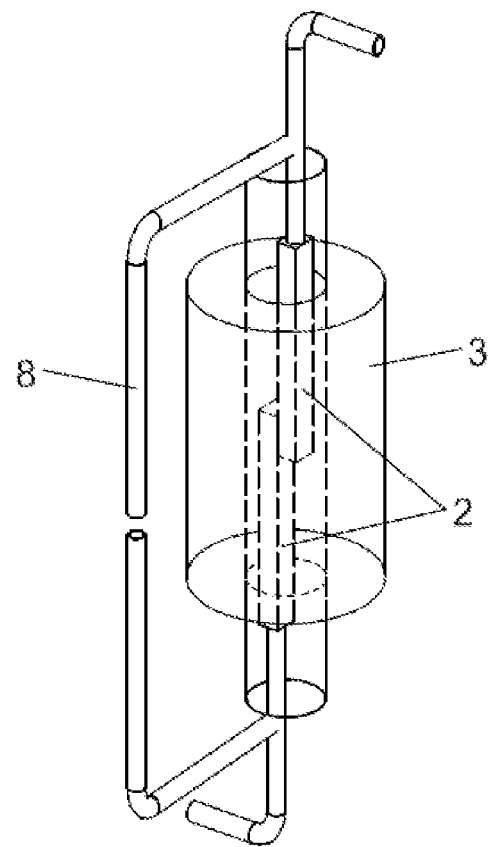
FIG. 2 is a model of the single vacuum reed relay with capacitor in accordance with the disclosure.
Figure 3:
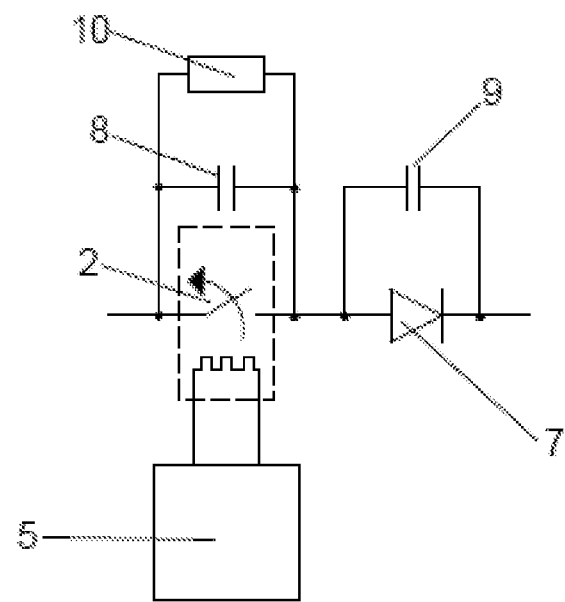
FIG. 3 is a schematic diagram of the module of the proposed switch in accordance with the disclosure.
Figure 4:
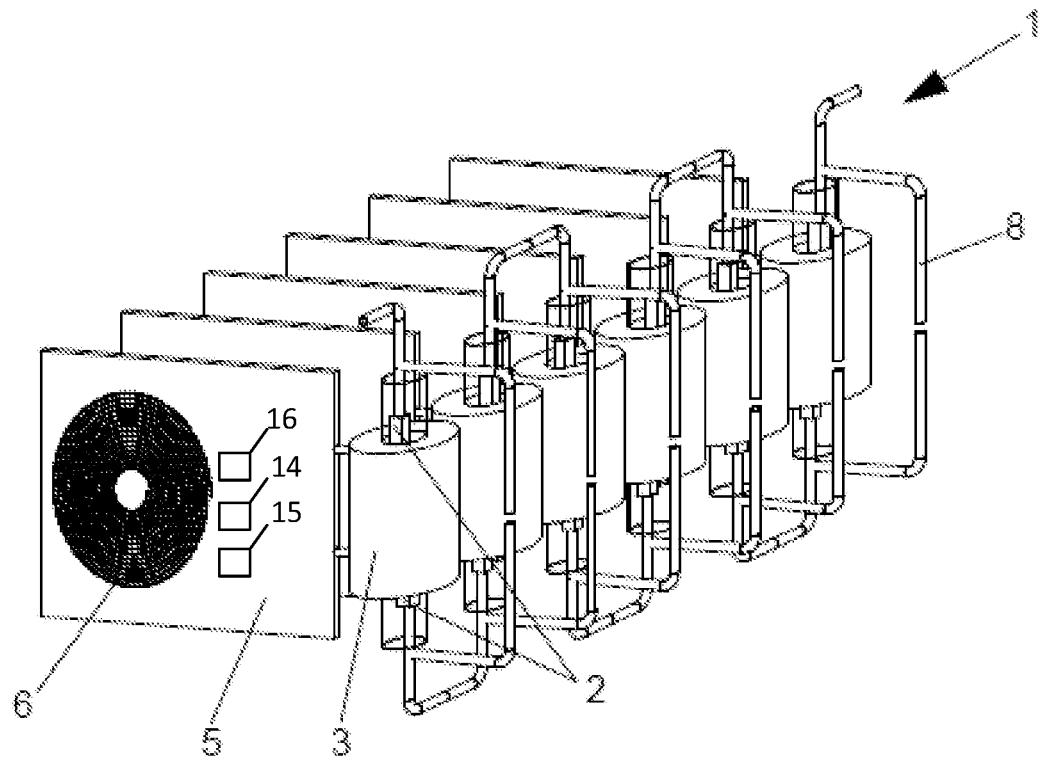
FIG. 4 is a model of the proposed switch having meandering arrangement of pairs of contacts in accordance with the disclosure.

A proposed switch 1 for a medium or high voltage traction line testing device is shown in FIG. 1, and additional views and alternative embodiments are shown in FIGS. 2-4. The switch 1 comprises a plurality of normally-opened pairs of contacts 2, in the form of vacuum reed relays, connected in series, wherein each pair of contacts 2 is equipped with a separate control coil 3. Dimensions of the pairs of contacts 2 is limited in order to reduce its inertia. Individual pair of contacts 2 close when the respective control coil 3 is supplied.

The switch 1 comprises also a wireless power transfer supply module 4, which is on ground potential and is used for supplying cascaded wireless power transfer receivers 5. Wireless power transfer supply module 4 is in the form of a transmitting board and comprises a transmitting coil 11, a high frequency inverter 12, and a microcontroller 13. High frequency inverter works with frequency in range 100-300 kHz. The inverter is responsible for the excitation of the transmitting coil.

Furthermore, the switch 1 comprises a plurality of cascaded wireless power transfer receivers 5 for supplying control coil of pairs of contacts. Each of the wireless power transfer receivers 5 is referenced to the floating potential and a comprises receiving coil 6, which are magnetically coupled.

Each of the control coils 3 is connected to one of the wireless power transfer receivers 5 and is supplied from the energy that is harvested by the receiving coil 6 of the wireless power transfer receiver 5.

The switch 1 further comprises a balancing capacitor 8, which is arranged in parallel to each pairs of contacts 2 and/or comprises balancing capacitor 9 arranged in parallel to blocking diodes 7 so that even voltage distribution between wireless power transfer receiver is obtained. The blocking diode 7 is rated for the same voltage as a pair of contacts 2.

The switch 1 further comprises balancing resistors 10 placed in parallel to each of pairs of contacts 2, wherein the resistance balancing resistors 10 is one range lower than DC resistance of the pairs of contacts 2.

Wireless power transfer receivers 6 are manufactured as the PCB's and further comprise an electronic rectifier and triggering circuit 16 for the control coil 3. Wireless power transfer receivers 5 comprise additionally a capacitor energy bank 14, preferably in the form of ceramic SMD capacitors.

Wireless power transfer receivers 5 are also equipped with one-way communication link 15 with the wireless power transfer supply module 4 for sending signal about closing of the relays In another preferred embodiment of the proposed switch 1, the pairs of contacts 2 have meandering arrangement, preferably with a layer of silicon resin between each of the pairs of contacts 2. It significantly improves the volume utilization. A layer of silicon resin provides proper isolation.

In yet another preferred embodiment of the proposed switch 1, said switch comprises several modules, wherein each module comprises a pair of contacts 2, control coil 3, wireless power transfer receiver 5 and blocking diode 7. The modules allow for easy expansion of the switch 1, which makes the solution scalable and allows the switch 1 to be adjusted to the assumed voltage.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A switch for a medium voltage (MV) or high voltage (HV) traction line testing device includes a plurality of normally-opened pairs of contacts connected in series, wherein each pair of contacts is equipped with a separate control coil, wherein the switch further comprises:
   a wireless power transfer supply module being on ground potential for supplying cascaded wireless power transfer receivers comprising a transmitting coil, high frequency inverter and microcontroller,
   a plurality of cascaded wireless power transfer receivers for supplying control coil of pairs of contacts;
   wherein each of the cascaded wireless power transfer receivers is referenced to a floating potential and comprises a receiving coil,
   wherein each of the separate control coils is connected to one of the cascaded wireless power transfer receivers,
   wherein receiving coils of the cascaded wireless power transfer receivers are magnetically coupled, and
   wherein the wireless power transfer supply module is located in a middle of the cascaded wireless power transfer receivers.

2. The switch according to claim 1, further comprising a blocking diode connected in series with each pair with pairs of contacts.

3. The switch according to claim 1, wherein the switch consists of a plurality of modules, each module comprising a respective pair of contacts, a respective control coil, a respective wireless power transfer receiver, and a respective blocking diode.

4. The switch according to claim 3, wherein each blocking diode is rated for a same voltage as the respective pair of contacts.

5. The switch according to claim 3, wherein the switch further comprises a respective balancing capacitor arranged in parallel to each of the respective pairs of contacts.

6. The switch according to claim 3, wherein the switch further comprises a respective balancing capacitor arranged in parallel to each of the respective blocking diodes.

7. The switch according to claim 3, wherein each of the respective pairs of contacts has a meandering arrangement, which includes a layer of silicon resin between each of the pairs of contacts.

8. The switch according to claim 1, wherein the pair of contacts is made as a vacuum reed relay.

9. The switch according to claim 8, wherein the balancing resistor is one range lower than DC resistance of the pair of contacts.

10. The according to claim 1, wherein the switch further comprises a balancing resistors placed in parallel to the pair of contacts.

11. The switch according to claim 1, wherein each of the cascaded wireless power transfer receivers comprises an additional capacitor energy bank.

12. The switch according to claim 11, wherein the additional capacitor energy bank is in a form of a ceramic surface-mounted device (SMD) capacitor.

13. The switch according to claim 1, wherein each of the cascaded wireless power transfer receivers further includes a one-way communication link with the wireless power transfer supply module operable to send a signal indicative of closing of relays.

14. The switch according to claim 1, wherein each of the cascaded wireless power transfer receivers further comprises an electronic rectifier and triggering circuit for the control coil.

15. The switch according to claim 1, wherein each of the cascaded wireless power transfer receivers is manufactured as a printed circuit board (PCB).

16. The switch according to claim 1, wherein the high frequency inverter of the wireless power transfer supply module operates at a frequency belonging in a range between 100 and 300 kHz.

* * * * *